US012621944B2

(12) United States Patent
Guzman et al.

(10) Patent No.: US 12,621,944 B2
(45) Date of Patent: May 5, 2026

(54) ATTACHMENT COMPONENTS AND METHODS FOR DATA PROCESSING SYSTEMS

(71) Applicant: Dell Products L.P., Round Rock, TX (US)

(72) Inventors: Richard William Guzman, Lago Vista, TX (US); John Charles Donachy, Austin, TX (US); Nicholas Lenn Poteracki, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 168 days.

(21) Appl. No.: 18/788,660

(22) Filed: Jul. 30, 2024

(65) Prior Publication Data

US 2026/0040465 A1 Feb. 5, 2026

(51) Int. Cl.
*H05K 5/02* (2006.01)

(52) U.S. Cl.
CPC ......... *H05K 5/0221* (2013.01); *H05K 5/0247* (2013.01)

(58) Field of Classification Search
CPC ........................... H05K 5/0221; H05K 5/0247
See application file for complete search history.

(56) References Cited

U.S. PATENT DOCUMENTS

| | | |
|---|---|---|
| 6,403,879 B1 | 6/2002 | Clements |
| 9,579,006 B1 | 2/2017 | Kirkpatrick |

| | | | |
|---|---|---|---|
| 2008/0233858 A1 | 9/2008 | Womac | |
| 2009/0143003 A1 | 6/2009 | Roesch | |
| 2014/0167578 A1 | 6/2014 | Lesser | |
| 2016/0270262 A1 | 9/2016 | Crawford | |
| 2016/0338220 A1 | 11/2016 | Crawford | |
| 2019/0104635 A1* | 4/2019 | Wang | E05C 9/10 |
| 2022/0243935 A1* | 8/2022 | Chen | H05K 7/20736 |
| 2024/0138097 A1 | 4/2024 | Tunks | |
| 2024/0138101 A1 | 4/2024 | Chen | |
| 2024/0138102 A1 | 4/2024 | Huang | |
| 2024/0256015 A1 | 8/2024 | Hartman | |
| 2025/0142756 A1 | 5/2025 | O'Donnell | |
| 2025/0142758 A1 | 5/2025 | Kuan | |

* cited by examiner

*Primary Examiner* — Jerry Wu

(74) *Attorney, Agent, or Firm* — WOMBLE BOND DICKINSON (US) LLP

(57) ABSTRACT

A data processing system is provided. The data processing system may include hardware components that are adapted to provide computer implemented services and positioned in a chassis. The data processing system may also include a chassis and a bezel module. The bezel module may include at least one bracket, an extension and a bezel. The at least one bracket may be adapted to directly attach to the chassis and the extension may be adapted to attach to the at least one bracket while attached to the chassis. The bezel may be adapted to attach to the extension while the at least one bracket is attached to the chassis and the extension is attached to the at least one bracket. The bezel module may allow for toe-in motion to attach the bezel to the chassis of the data processing system.

20 Claims, 14 Drawing Sheets

Bezel 108

Side Surface of Extension 138

Bezel Module 102

Extension 110

Rear Side of Extension 142

Front Side of Extension 140

Bezel 108

Extension 110

Bezel Module 102

Cover Elements 144

Side Surface of Extension 138

Brackets 112

Actuation Mechanism 134

Bezel 108

First Set of Hooks 132

Actuation Mechanism 134

Second Set of Hooks 130

Locking Mechanism 154

Mechanical Coupling 140

First Set of Hooks 132

Bezel 108

Actuation Mechanism 134

Locking Mechanism 154

Second Set of Hooks 130

Brackets
112

First
Bracket
120

Second
Bracket
122

ATTACHMENT COMPONENTS AND METHODS FOR DATA PROCESSING SYSTEMS

FIELD OF THE DISCLOSURE

Embodiments disclosed herein generally relate to data processing systems. More particularly, embodiments disclosed herein relate to chassis for data processing systems.

BACKGROUND

Computing devices may provide various types of computer implemented services. To provide the computer-implemented services, computing devices may include various type of hardware devices such as, for example, processors, memory modules, and storage devices. These hardware components may need to be positioned with one another to provide their respective functions. Similarly, various components devices may be aggregated together to form a computing system.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1:
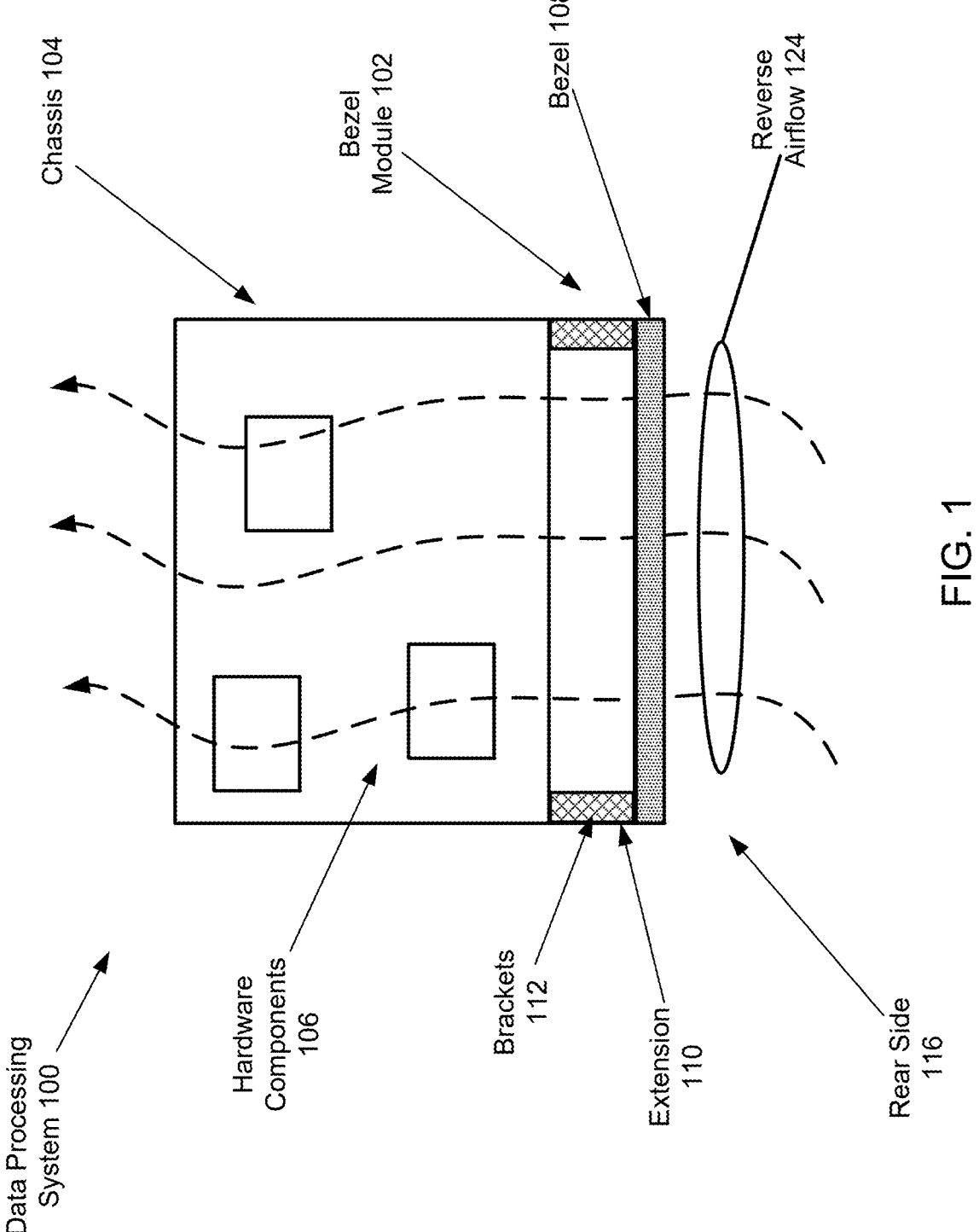
FIG. 1 shows a diagram illustrating a portion of a functional portion of a data processing system in accordance with an embodiment.

Various embodiments will be described with reference to details discussed below, and the accompanying drawings will illustrate the various embodiments. The following description and drawings are illustrative of the embodiment disclosed herein and are not to be construed as limiting the disclosed embodiments. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment disclosed herein. The appearances of the phrases "in one embodiment", "an embodiment", and similar recitations in various places in the specification do not necessarily all refer to the same embodiment.

In general, embodiments disclosed herein relate to systems and methods for providing computer implemented services. To provide computer implemented services, data processing systems may include hardware components. The hardware components may consume electricity, provide the computer implemented services using the electricity, and may become heated as a result of consuming electricity. Continued operation of the hardware components may depend on maintaining a low and/or cool temperature during operation.

To manage heated hardware components and reducing the likelihood of failure of the hardware components, a ventilation system may be used to cool the hardware components. The ventilation system may enable airflows to circulate through a chassis of the data processing system. To do so, the ventilation system may include various internal and/or external (e.g., to the chassis) components that facilitate various directional airflows. Based on the use of internal and/or external components, the airflows may be provided from a front and/or rear portion of the data processing system which may present a challenge depending on the design of the chassis.

To manage the airflows, the data processing system may include a bezel module. the bezel module may be adapted to physically connect to the chassis of the data processing system. When so connected, the bezel module may provide a variety of functions. For example, when attached to a front side of the chassis, the bezel module may provide a normal airflow (NAF) and filter the air flowing through the chassis (and around the hardware components) to reduce heat and/or increased temperature of the hardware components within the chassis.

To attach the bezel module, the bezel module may include attachment elements (e.g., hooks, brackets, extensions, etc.). The attachment elements may be adapted to physically connect to the chassis of the data processing system. When so connected, the bezel module may provide a variety of functions. For example, the bezel module may filter the airflows through the chassis to reduce buildup of undesired materials within the chassis. Once inserted, various interferences between the attachment elements and the bezel may prevent removal of the bezel.

In addition to providing filtration functions, the bezel module may provide other types of functionalities. For example, the bezel module may include an extension to constrain direction of airflow and allow cable routing (e.g., when attached at a rear side of the chassis). Consequently, the functionality of bezel module may be customized based on different data processing system architectures and/or desired functionalities through attachment of bezel module to the chassis of the data processing system.

Thus, embodiments disclosed herein may provide various benefits.

In an embodiment, a data processing system is provided. The data processing system may include hardware components that are adapted to provide computer implemented services and positioned in a chassis; the chassis; and a bezel module comprising: at least one bracket adapted to directly attach to the chassis, an extension adapted to attached to the at least one bracket while the at least one bracket is attached to the chassis, and a bezel adapted to attach to the extension while the at least one bracket is attached to the chassis and the extension is attached to the at least one bracket.

The bezel may be adapted to attach to the at least one bracket using a toe-in-motion.

The bezel may also include: a first set of hooks positioned on a first side of the bezel; and a second set of hooks.

The first set of hooks may be static and adapted to fixedly secure the bezel to a first bracket of the at least one bracket.

The second set of hooks may be dynamic and adapted to fixedly secure the bezel to a second bracket of the at least one bracket.

The second set of hooks may be mechanically coupled to an actuation mechanism of the bezel, the actuation mechanism being adapted to receive force from a user and actuate the second set of hooks when the force is received.

The second set of hooks may be adapted to move between a first position and a second position based on the actuations by the actuation mechanism, while in the first position the second set of hooks establish an interference with the at least one bracket to prevent the bezel from being disconnected from the at least one bracket, and while in the second position the interference is relieved to enable the bezel to be disconnected from the at least one bracket.

The bezel may be adapted to be disconnected from the at least one bracket with a depression of the actuation mechanism and without depressions of any other actuation mechanisms.

The bezel may also include a mechanical coupling that mechanically couples the actuation mechanism to the second set of hooks, and that does not mechanically couple the actuation mechanism to the first set of hooks.

The bezel may be further adapted to attach to a front side of the chassis independently from the at least one bracket and the extension, the at least one bracket being adapted to attached to a rear side of the chassis.

The extension may be adapted to facilitate routing of cables to the rear side of the chassis while the bezel module is attached to the rear side of the chassis.

The extension may also include at least one opening for the cables to traverse, the at least opening being on a side surface of the extension, and the chassis and bezel being on a front and a rear side of the extension while the bezel module is attached to the chassis.

In an embodiment, a system may include: a chassis for housing hardware components that are adapted to provide computer implemented services; and a bezel module comprising: at least one bracket adapted to directly attach to the chassis, an extension adapted to attached to the at least one bracket while the at least one bracket is attached to the chassis, and a bezel adapted to attach to the extension while the at least one bracket is attached to the chassis and the extension is attached to the at least one bracket.

In an embodiment, a bezel module as discussed above is provided.

In an embodiment, a method of assembling a data processing system is provided.

In an embodiment, a method of disassembling a data processing system is provided.

Figure 2:
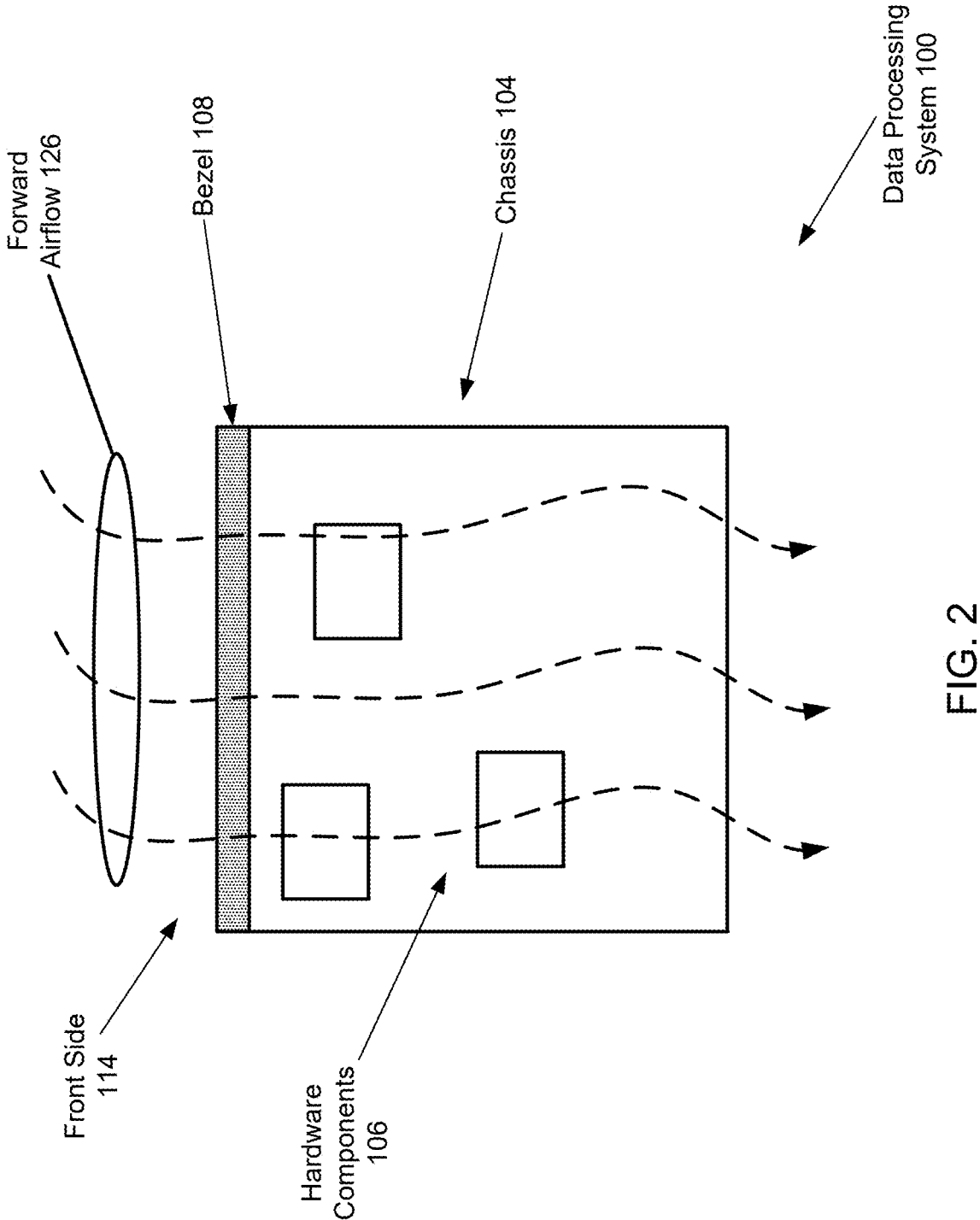
FIG. 2 shows a diagram illustrating a portion of a functional portion of a data processing system in accordance with an embodiment.

Turning to FIGS. 1 and 2, diagrams illustrating portions of a bezel module 102 adaptable to fix to a data processing system 100 in accordance with an embodiment is shown. FIG. 1 shows a top view of data processing system 100 with reverse airflow provided through a chassis (e.g., 104) of the data processing system. FIG. 2 shows a top view of data processing system 100 with normal airflow provided through the chassis (e.g., 104) of the data processing system.

To provide the computer implemented services, data processing system 100 may include a chassis (e.g., 104) and various hardware components (e.g., 106) positioned therein. The hardware components may include, for example, processors, memory modules, storage devices, special purposes computer devices (e.g., graphics/data processing units), and/or other components.

During operation of the hardware components, electricity may be consumed and heat may be generated as a byproduct of operation of the hardware components. The hardware components may include various limits on their operation environment such as temperature limits. Consequently, if the temperature of the hardware components exceeds this example prescribed limit, then the hardware components may not operate as desired. For example, the hardware components may exhibit errors during operation, may not be able to operation at normal rates, may entirely fail to operate, etc.

In general, embodiments disclosed herein relates systems, methods, and devices for facilitating forward and/or reverse airflows in a chassis of a data processing system. To facilitate forward and/or reverse airflows, external and/or internal (e.g., of the chassis) components may generate air to flow through the chassis. The flows of air may be used, for example, to regulate the temperatures of hardware components positioned within the chassis.

To provide the above noted functionality, data processing system 100 may include a bezel module (e.g., 102) in order to filter air flowing through chassis 104. Bezel module 102 may include bezel 108, extension 110, and/or brackets 112. Bezel module 102 may be implemented with various structures adaptable to attach to a chassis (e.g., 104) of data processing system 100.

The bezel module 102 may be structured in a manner that enables a variety of other types of chassis architecture to be reversibly secured to the bezel (e.g., 108). For example, the bezel module 102 may include various structures to which a front side and/or rear side of a chassis may reversibly secure themselves. To do so, bezel module 102 may include bezel 108, extension 110, and/or brackets 112.

Figure 8A:
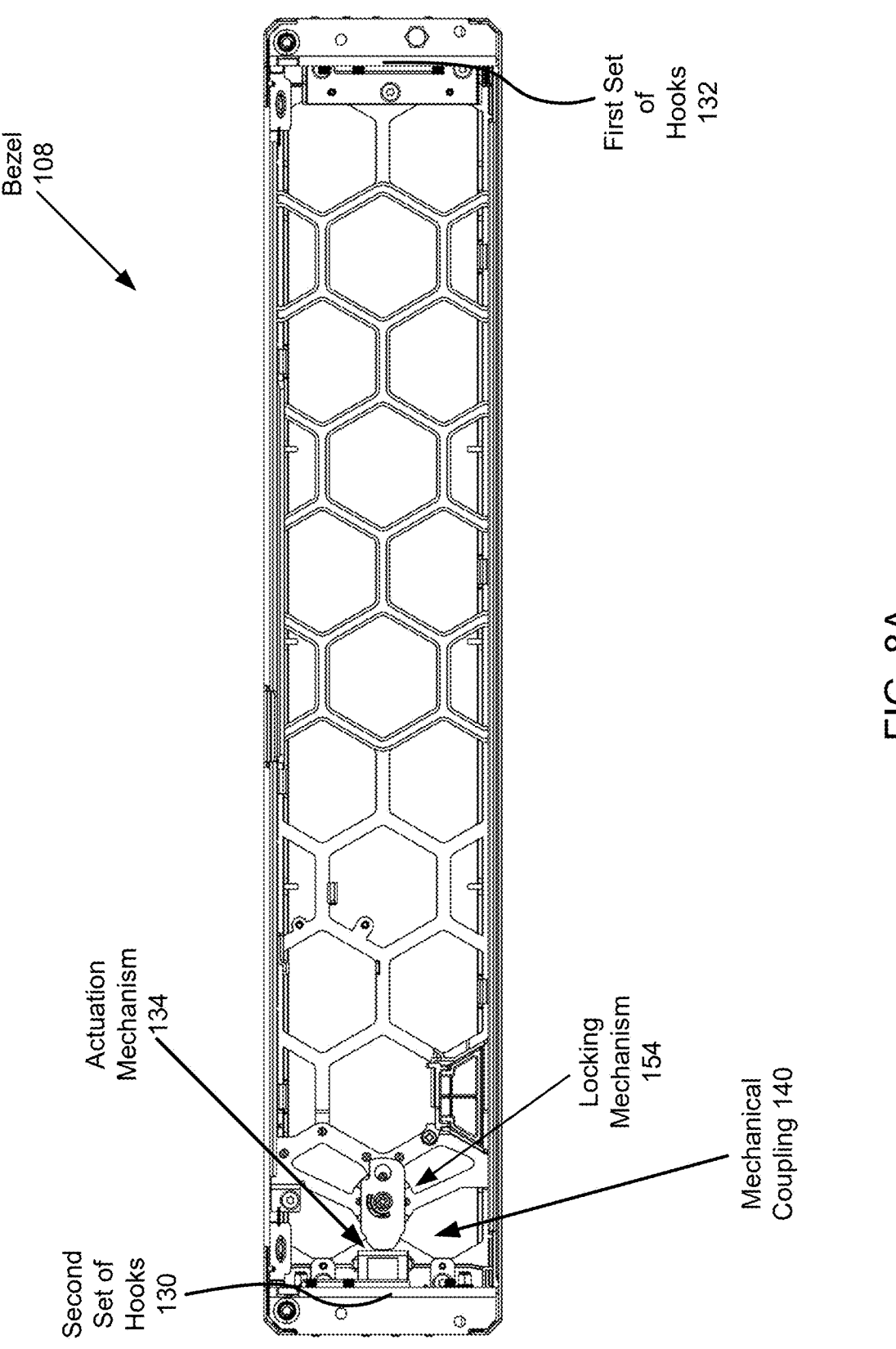
FIG. 8A shows a rear side view diagram illustrating a portion of a bezel module of a data processing system in accordance with an embodiment.
Figure 8B:
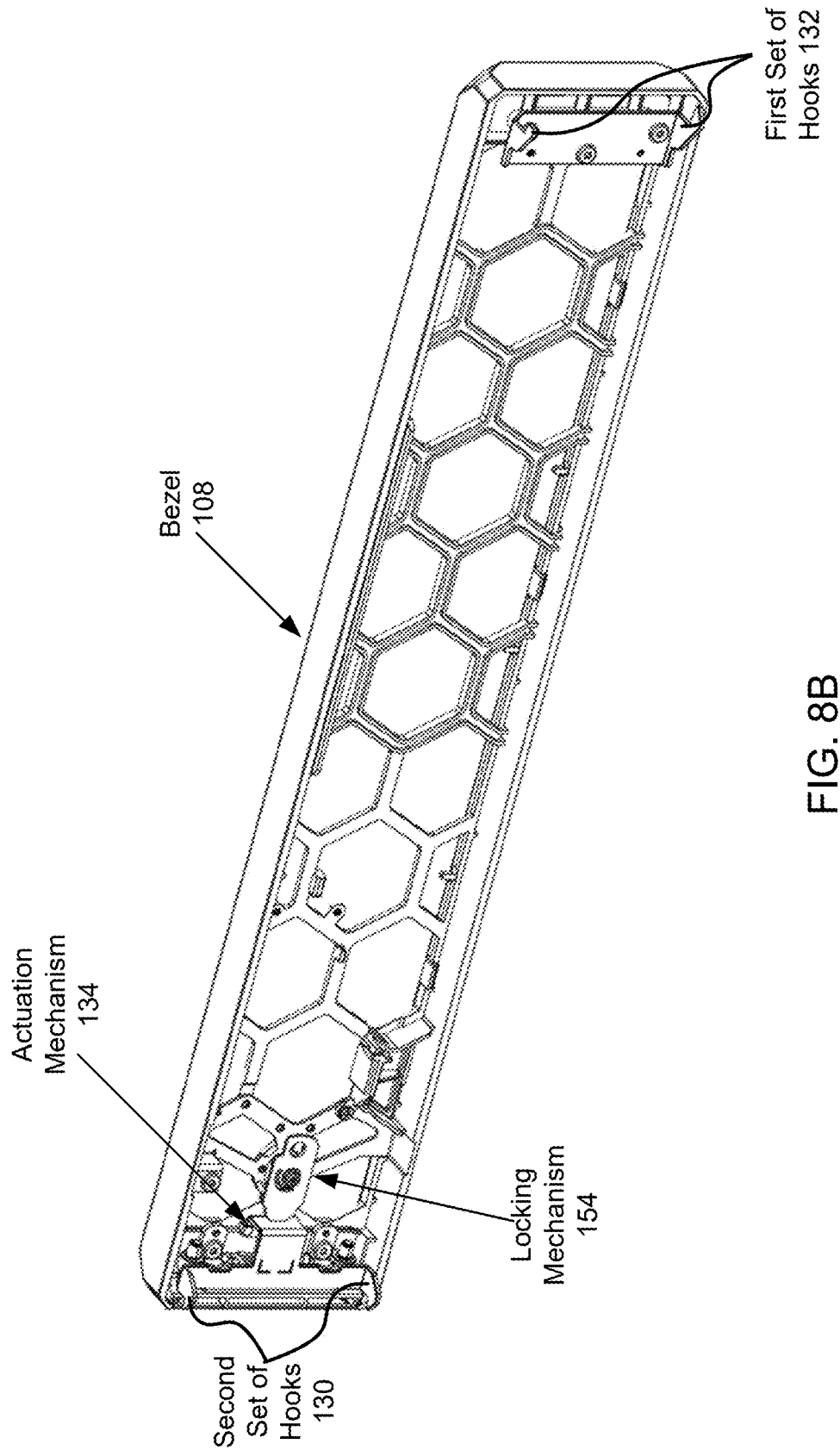
FIG. 8B shows an isometric view diagram illustrating a portion of a bezel module of a data processing system in accordance with an embodiment.

Bezel 108 may include a filtration structure that facilitates filtration of the air flowing into the chassis from a rear side (e.g., 116) of the chassis (e.g., 104). For example, bezel 108 may be implemented as a metallic member that attach to one or more brackets (e.g., 112) via one or more set of hooks positioned on one side of bezel 108. Refer to FIGS. 8A and 8B for additional details regarding attachment components of bezel 108.

Extension 110 may include a structural member that facilitates separation of bezel 108 from chassis 102 as well as constrain direction of airflow and/or cable routing. For example, extension 110 may be implemented as a tubular metallic member that may attach to brackets 112 and may establish a flow channel through which air may flow from the rear side (e.g., 116) of the chassis (e.g., 104) out through or into bezel 108.

Figure 7:
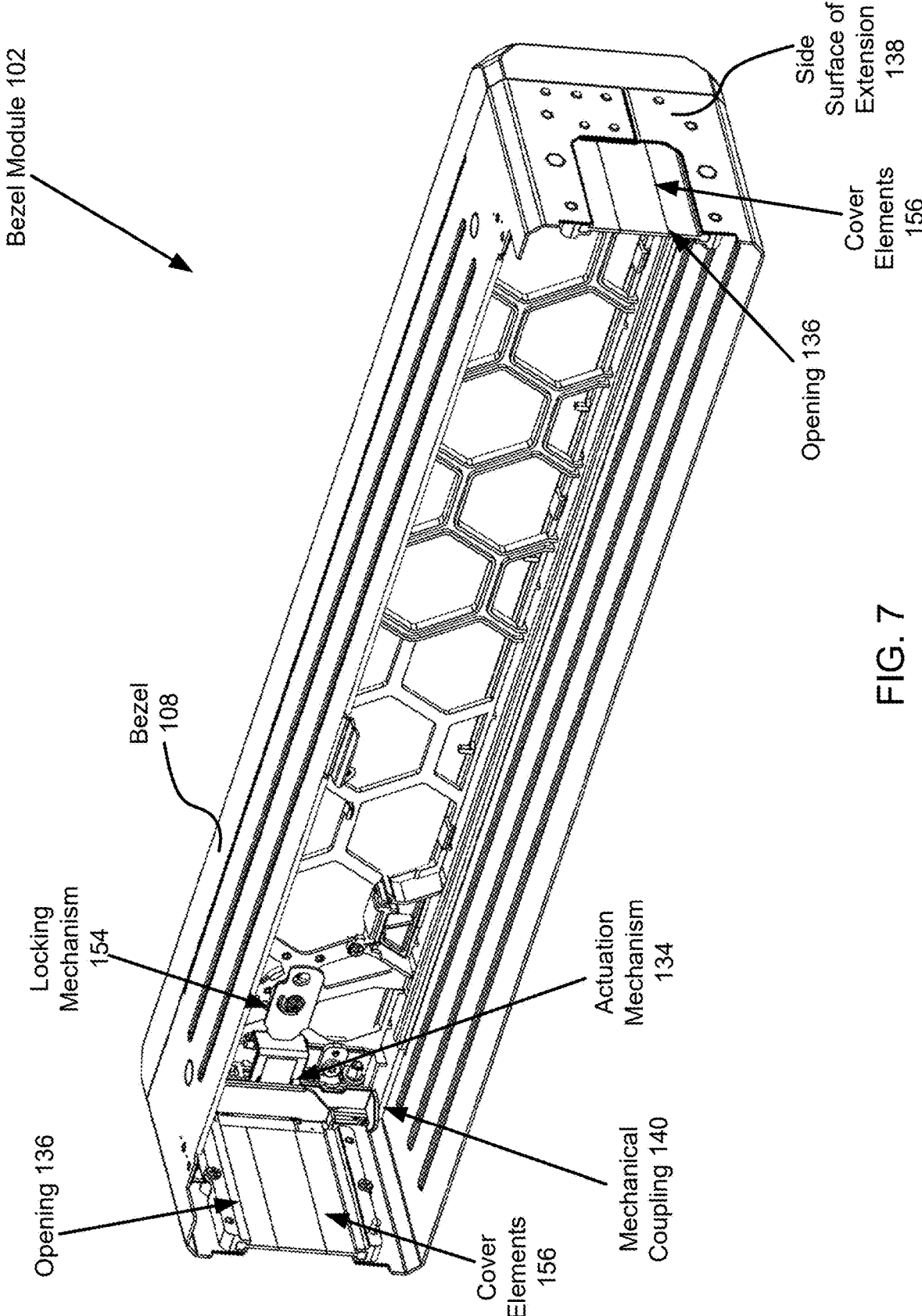
FIG. 7 shows a rear isometric view diagram illustrating a portion of a bezel module of a data processing system in accordance with an embodiment.
Figure 10:
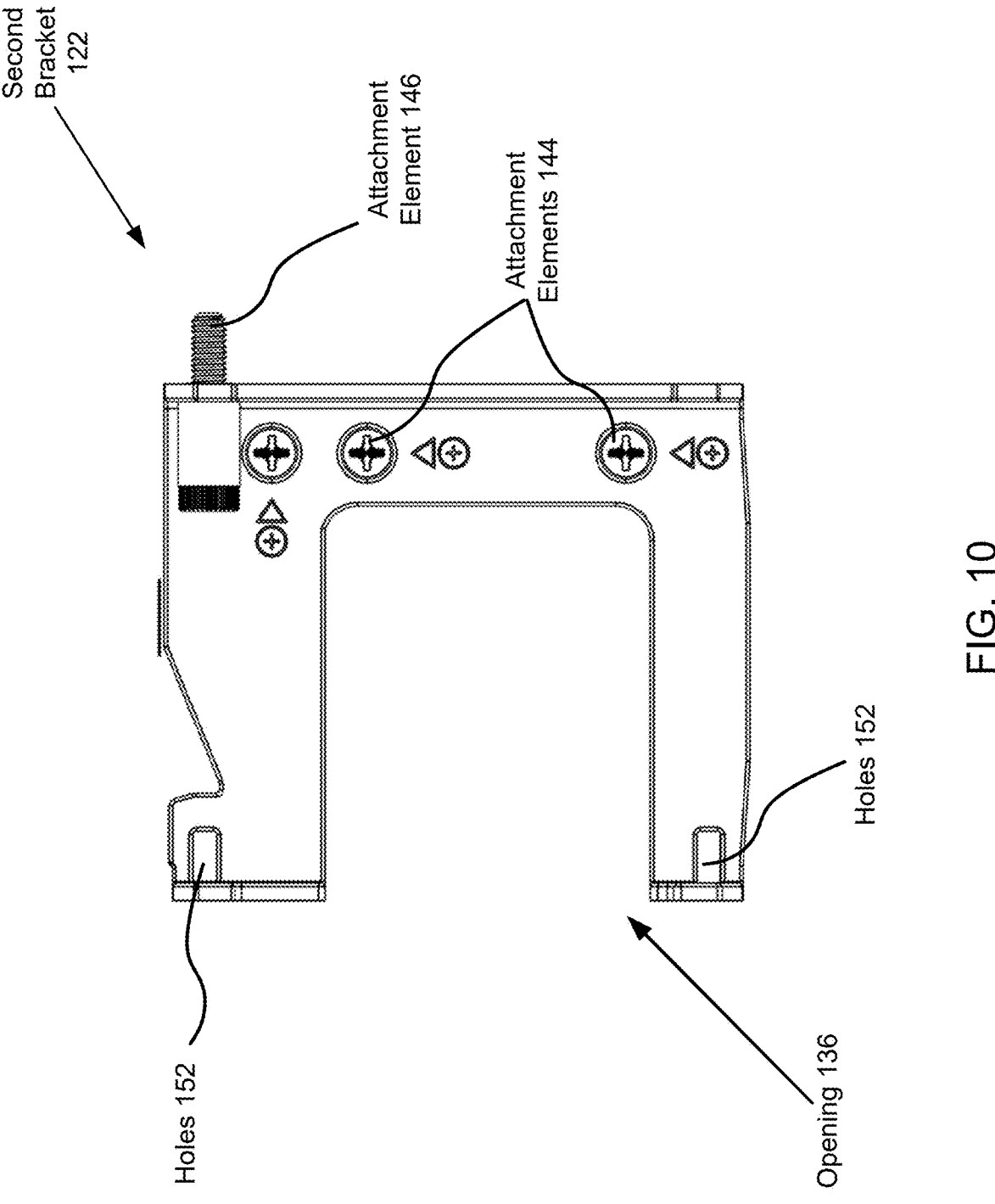
FIG. 10 shows a first side view diagram illustrating a portion of brackets of a bezel module of a data processing system in accordance with an embodiment.

As shown in FIG. 1, while attached to the rear side (e.g., 116) of chassis 104, bezel module 102 may perform various functions such as, for example, filtering flows of air through bezel 108, enabling airflow into and/or through chassis 104, routing cables out through sides of extension 110, etc. Refer to FIGS. 7 and 10 for additional information regarding functionalities of extension 110.

Conversely, some chassis architectures may provide for a bezel connection at a front side of the chassis. For example, as shown in FIG. 2, bezel 108 may attach to a front side (e.g., 114) of chassis 104 to filter air flows into the interior of chassis 104 through the front side of the chassis. As shown in FIG. 2, some components of bezel module 102, such as extension 110 and brackets 112 may not be utilized in order to connect bezel 108 to chassis 104.

While the aforementioned components of bezel module 102 are attached to chassis 104, various air flows (e.g., 124 and/or 126) may still circulate through the interior of chassis 104. Example air flows are shown in FIGS. 1 and 2 using arrows with long dashed, wavy tails. Thus, as seen in FIGS. 1 and 2, the presence of the bezel module may not prevent desired quantities of air from circulating to the interior of chassis 104 even while the components of the bezel module are positioned with chassis 104.

Figure 3:
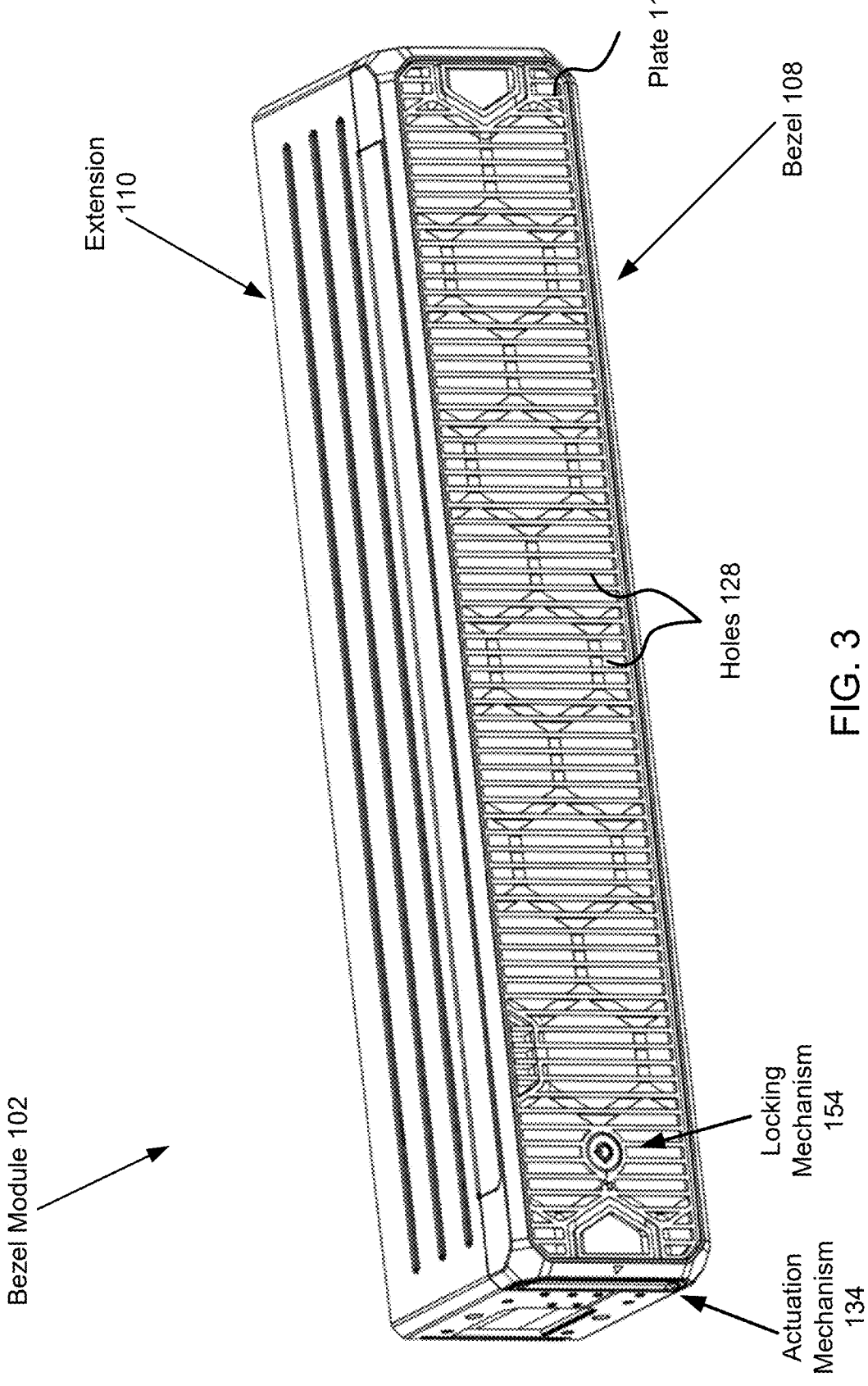
FIG. 3 shows a front isometric view diagram illustrating a portion of a bezel module of a data processing system in accordance with an embodiment.
Figure 4:
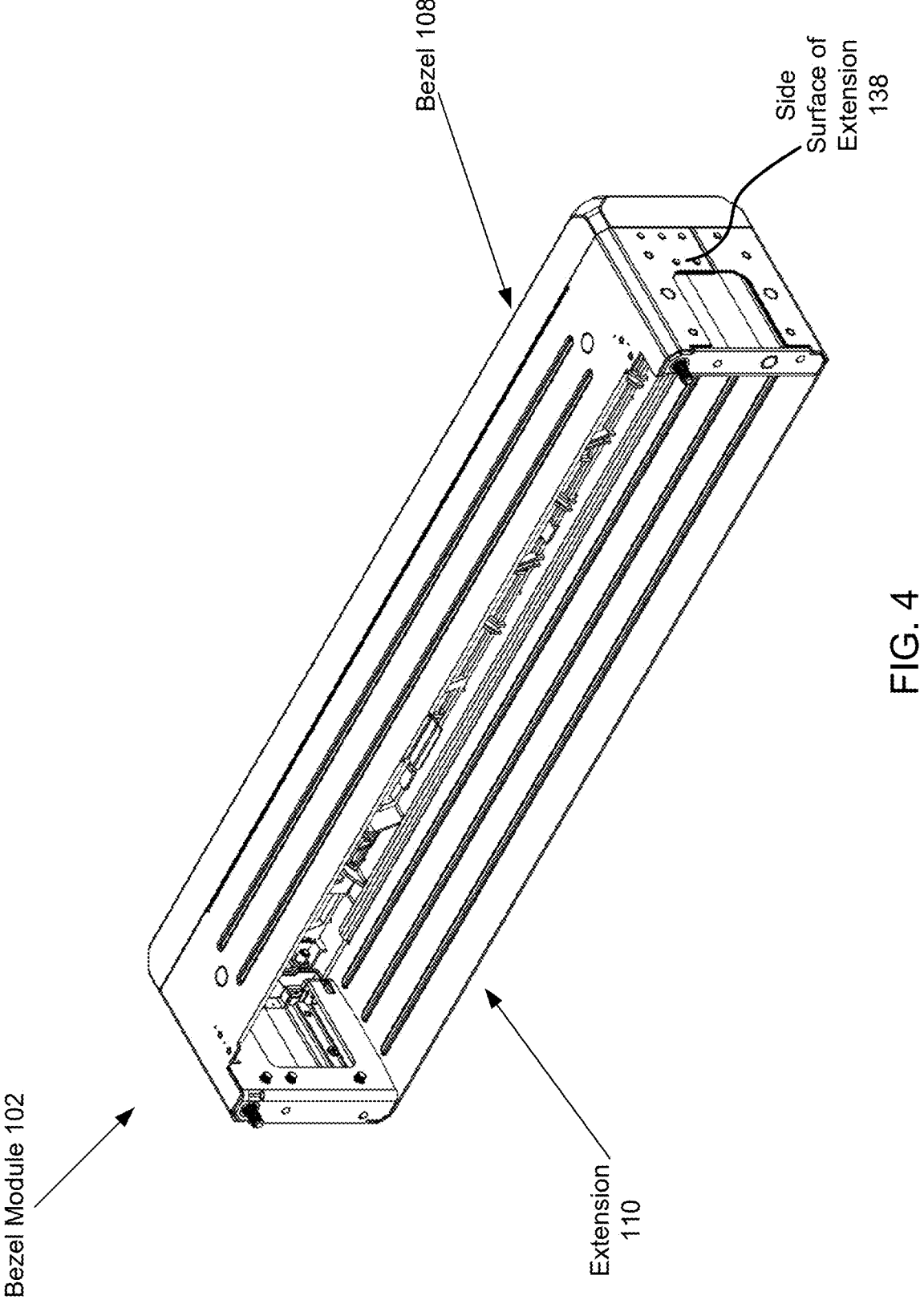
FIG. 4 shows a rear isometric view diagram illustrating a portion of a bezel module of a data processing system in accordance with an embodiment.
Figure 5:
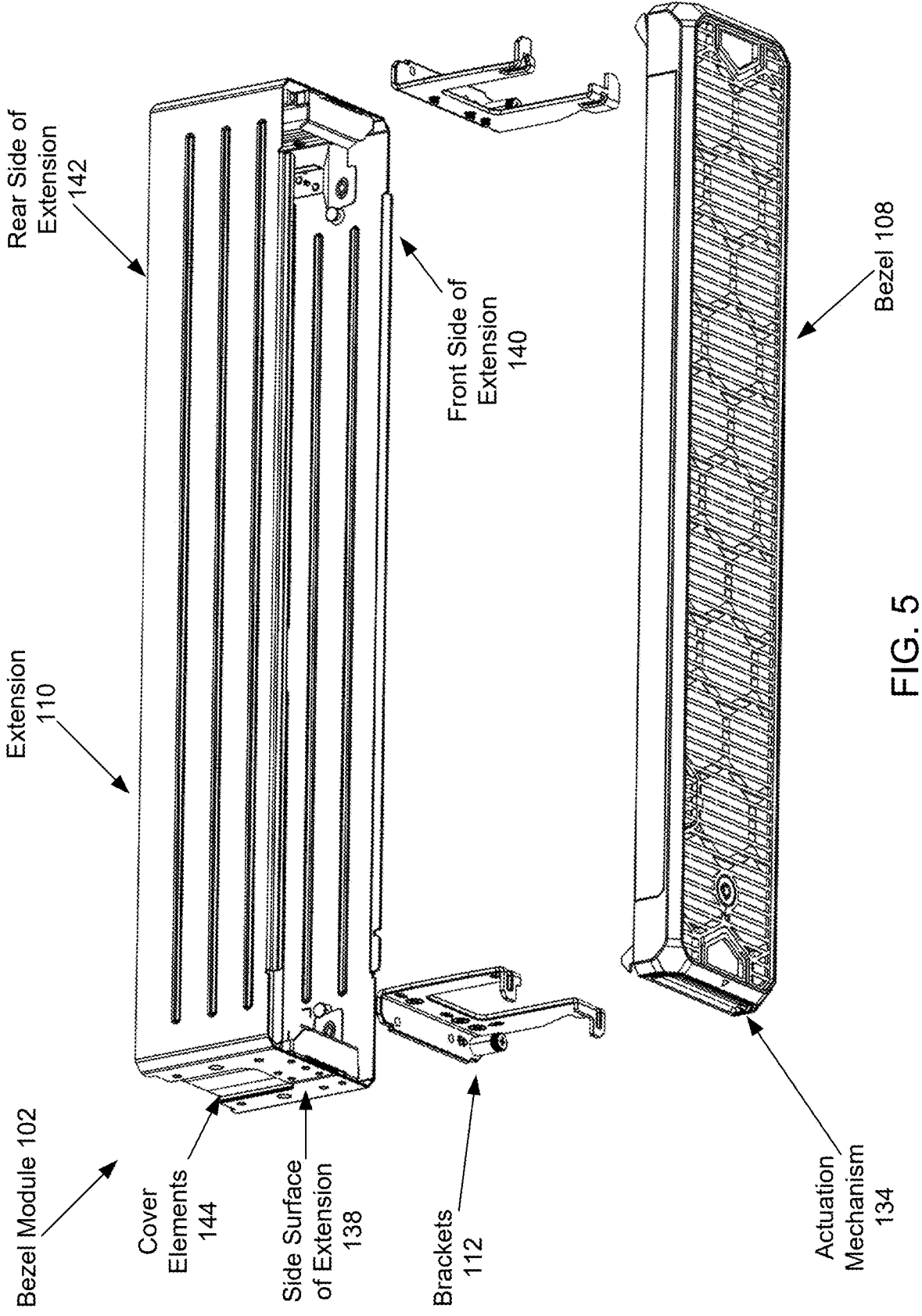
FIG. 5 shows an expansion view of a portion of a bezel module of a data processing system in accordance with an embodiment.

Turning to FIGS. 3-5, diagrams illustrating portions of bezel module 102 in accordance with an embodiment are shown. FIGS. 3 and 4 show front and rear isometric views, respectively, of bezel module 102 and FIG. 5 shows an exploded view of bezel module 102 and/or an expansion view of all the components of bezel module 102.

In FIGS. 3 and 4, bezel module 102 may include bezel 108, extension 110, brackets 112, and/or any other components not explicitly shown in the figures. Bezel 108 may attach to chassis 104 (e.g., shown in FIG. 1) via brackets 112 and/or extension 110. To attach bezel 108, a toe-in motion may be used by sliding one side of the bezel to line up with one end of extension 110. Refer to FIGS. 5-6, and 8A-8B for additional information regarding attachment elements of bezel 108. Bezel 108 may include a filtration assembly (e.g., plate, filter screen, holes, etc.) to facilitate filtration of air flows into chassis 104. Bezel 108 may include any number of holes 128 in a plate (e.g., 118). Plate 118 may be a structural member (e.g., include a plastic/metal plate). Plate 118 may include various features (not shown) that enable it to be attached to portion of bezel 108 (e.g., mounting holes, bolts, etc.). The holes (e.g., 128) in plate 118 may enable airflow to traverse the area in which plate 118 is positioned. While described with respect to a plate, the structural member through which the holes are through may have other shapes without departing from embodiments disclosed herein. Additionally, while illustrated in FIGS. 3, 5, 6 as having a rectangular cross section, the holes may have other cross section shapes without departing from embodiments disclosed herein. Further, while shown as being arranged in a uniform grid, the holes may be distributed across bezel 108 differently without departing from embodiments disclosed herein.

To provide for a variety of functions (e.g., constrain direction of airflow, allow cable routing, etc.), extension 110 may include various physical features. These features may include attachment elements (e.g., 144 and/or 146 shown in FIG. 10) which allows extension 110 to attach to chassis 104 and/or bezel 108. Refer to FIGS. 5, 7, 10, and 11 for additional information regarding extension 110. Extension 110 may be a structural element that separates bezel 108 from chassis 104. The distance of separation may be, for example, sufficient to allow routing cables coming out from chassis 104 and direct the cables to run out through one or more sides of extension (e.g., 138).

In FIG. 5, components of bezel module 102 are shown as individually separated, however, it is to be appreciated that the components may be fixedly attached to each other.

Figure 9:
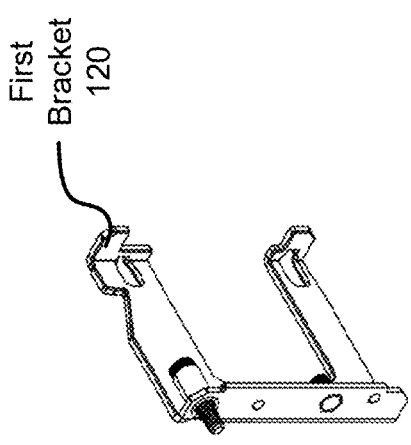
FIG. 9 shows an isometric view diagram illustrating a portion of brackets of a bezel module of a data processing system in accordance with an embodiment.
Figure 9:
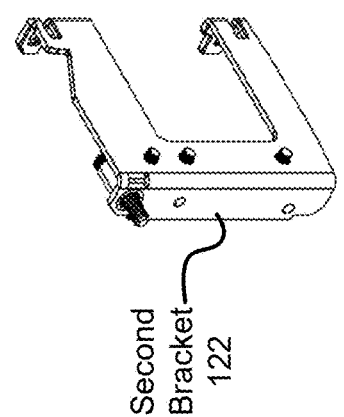
Figure 11:
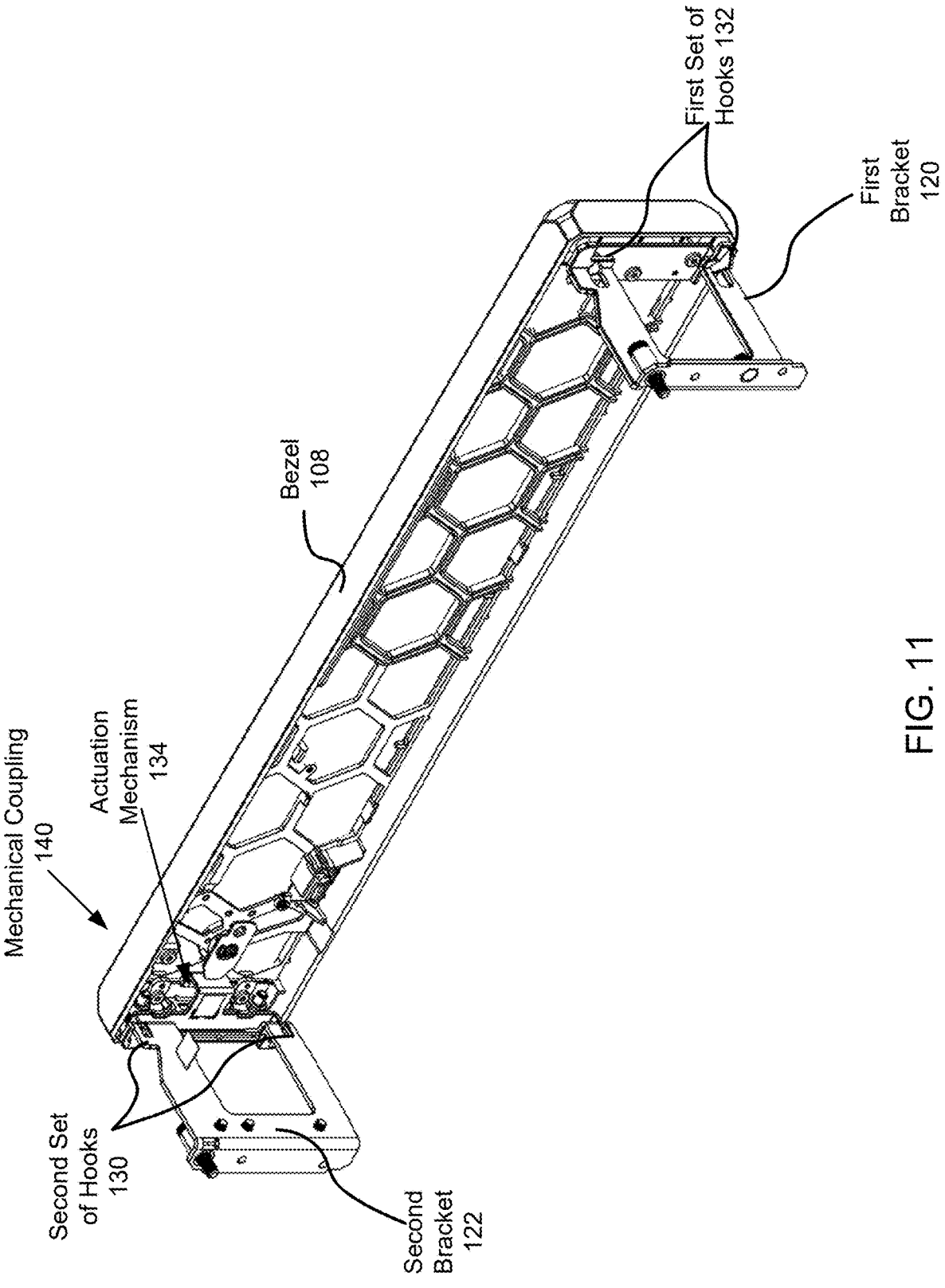
FIG. 11 shows a rear isometric view diagram illustrating an example of a portion of a bezel module of a data processing system in accordance with an embodiment.

To attach bezel 108 to extension 110 and extension to chassis 104, brackets 112 may be utilized. Brackets 112 may be adapted to directly attach to the chassis (e.g., 104), and to attach to extension 110 (e.g., while at least one bracket of brackets 112 is attached to the chassis). Brackets 112 may include, for example, one or more brackets (e.g., 120 and/or 122; shown in FIGS. 9-11) adaptable to attach to a front side of extension (e.g., 140) and a back side of bezel 108. Refer to FIGS. 9-11 for additional details regarding brackets 112.

Figure 6:
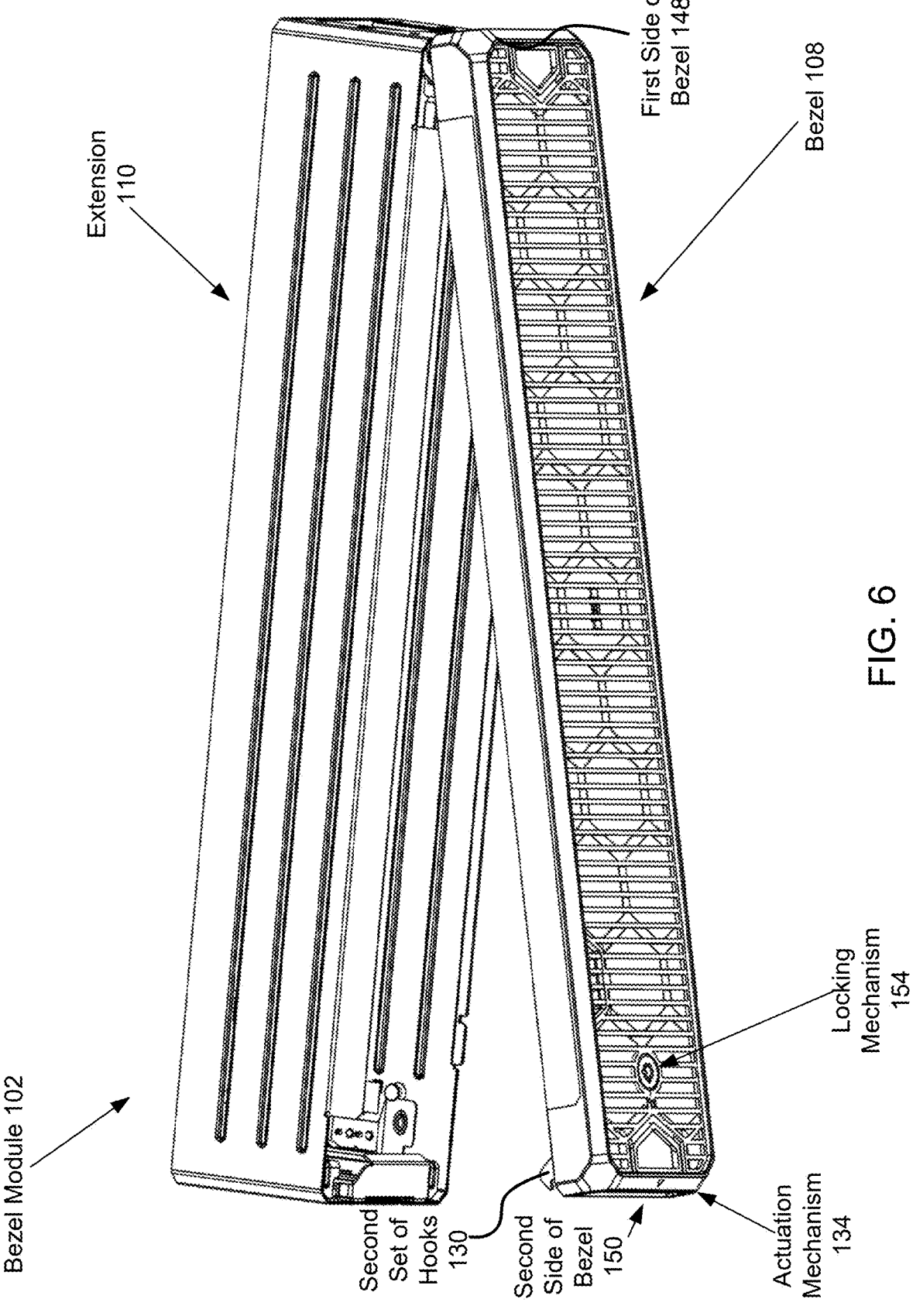
FIG. 6 shows a front isometric view diagram illustrating a portion of a bezel module of a data processing system in accordance with an embodiment.

Turning to FIGS. 6-7, front and rear isometric view diagrams of bezel module 102 in accordance with an embodiment are shown. In addition, the bezel (e.g., 108) has been rotated 180 degrees in the view shown in FIG. 7.

In FIG. 6, one side of bezel 108 (e.g., second side of bezel 150) is shown positioned near but not attached to extension 110. To secure bezel 108 to extension 110, a first side of bezel (e.g., 148) may be fixedly attached to extension 110 (e.g., via at least one of brackets 112). Once attached, actuation mechanism 134 may receive force, for example, from a user that actuates a second set of hooks (e.g., explicitly shown in FIGS. 8A-8B) to move from first position to a second position, thereby relieving an interference of the second set of hooks establishing a connection with the at least one bracket. Consequently, a user may slide the second side of bezel 150 (e.g., and second set of hooks 130) to attach to extension 110 via at least one bracket. To prevent undesired movement of actuation mechanism 134, bezel 108 may include locking mechanism 154. Locking mechanism 154 may be implemented, for example, using a pancake lock components that enables and/or disables actuation mechanism 134 to release the second set of hooks of bezel 108 from extension 110 and/or chassis 104. For example, locking mechanism 154 may rotate in a direction to constrain movement of actuation mechanism 134 and thus, movement of second set of hooks 130.

To facilitate movement of bezel 108 with respect to extension 110, bezel 108 may include a mechanical coupling (e.g., 140; shown in FIG. 7). The mechanical coupling 140 may mechanically couple the actuation mechanism (e.g., 134) to the second set of hooks while not providing a mechanical coupling of the actuation mechanism to the first set of hooks.

For example, depression of actuation mechanism 134 may cause second set of hooks 130 to move and allow disconnection of one side of bezel (e.g., 150) from extension 110. Consequently, when actuation mechanism 134 is actuated by a user, for example, by receiving force from a user, mechanical coupling 140 may allow the second set of hooks to move in the second position thereby relieving the interference to enable second side of bezel 150 to be disconnected from at least one of the brackets while allowing a first side of bezel 148 to remain attached to extension 110.

For example, in FIG. 7, bezel 108 is shown secured to extension 110. As seen from the figure, locking mechanism 154 may prevent actuation of actuation mechanism 134 and movement of second set of hooks (e.g., 130) via mechanical coupling 140, thereby preventing bezel 108 from disconnecting from extension 110. As a result, a toe-in motion may be utilized to attach and/or remove bezel 108 to and/or from extension 110.

Additionally, as seen in FIG. 7, opening 136 may allow cables to rotate and come out the sides of extension 110 while preventing debris from entering airflow into bezel module 108 and/or reducing airflow impedance. Additionally, while illustrated in FIGS. 4-5, and 7 as having a rectangular cross section, the opening may have other cross section shapes without departing from embodiments disclosed herein.

To prevent debris and air flowing through opening 136, extension 110 may include cover elements 144. The cover elements 156 may, for example, cover all or a portion of the opening (e.g., 136) positioned on both sides of extension 110. Cover elements 156 may be implemented, for example, with flexible brushes attached to a side surface of extension (e.g., 138) to allow a surface where the cables may pass there through.

Turning to FIGS. 8A-8B, rear and isometric view diagrams, respectively, of bezel 108 in accordance with an embodiment are shown. In addition, the bezel (e.g., 108) has been rotated 180 degrees in the views shown in FIGS. 8A and 8B. In FIGS. 8A and 8B, bezel 108 may include attachment elements such as second set of hooks 130, first set of hooks 132, etc. adapting bezel 108 to attach to extension 110 via one or more brackets (e.g., 112). The first set of hooks 132 may be positioned on a first side of bezel and the second set of hooks 130 may be positioned on a second side of the bezel (e.g., on opposite ends of bezel 108). First set of hooks 132 may be static and adapted to fixedly secure bezel 108 to first bracket 120 (shown in FIGS. 9 and 11). Conversely, second set of hooks 130 may be dynamic (e.g., moveable) and adapted to fixedly secure bezel 108 to second bracket 122 (e.g., shown in FIGS. 9 and 11).

In FIGS. 8A and 8B, a mechanical coupling 140 of bezel 108 is shown securing actuation mechanism 134 to second set of hooks 130. For example, second set of hooks 130 may be mechanically coupled to actuation element 134 of bezel 108 so that when actuated, actuation element 134 may move the second set of hooks (e.g., 130) from a first position to a second position. The first position of the second set of hooks may establish an interference with the at least one bracket that prevents one side of bezel 108 form being disconnected from the at least one bracket.

Mechanical coupling 140 may provide a mechanical coupling of the actuation mechanism (e.g., 134) to the second set of hooks (e.g., 130) and not provide a mechanical coupling of the actuation mechanism to the first set of hooks (e.g., 132). As a result, when actuation mechanism 134 is actuated (e.g., by a user), first set of hooks 132 may remain connected to the at least one bracket while the second set of hooks 130 may be disconnected from the other bracket (e.g., second bracket 122; shown in FIGS. 9 and 11).

Turning to FIGS. 9-10, isometric and side view diagrams, respectively, of brackets 112 in accordance with an embodiment are shown.

As discussed above and shown in FIG. 9, brackets 112 may include a first bracket 120 and second bracket 122. First bracket 120 and/or second bracket 122 may include holes (e.g., 152) positioned on each of the brackets. The holes 152 of each bracket may correspond to a position to the set of hooks of the bezel 108 such that each set of hooks may attach to the holes of the corresponding bracket. For example, holes 152 of second bracket 122 may be positioned to align with second set of hooks 130 and allow the second set of hooks 130 to securely latch on to second bracket 122. Although not explicitly shown, it is to be understood that holes of a first bracket 120 may be positioned to align with first set of hooks 132 and allow the first set of hooks 132 to securely latch on to first bracket 120.

In FIG. 10, second bracket 122 is shown. Second bracket 122 may be attached to extension 110 via attachment elements 144. Attachment elements 144 may be implemented, for example, using metallic screws to fixedly secure to second bracket 122 to extension 110. Attachment element 146 may be used to attach second bracket 122 to chassis 104. Similarly, attachment elements 146 may be implemented, for example, using metallic screws to fixedly secure second bracket 122 to chassis 104.

Turning to FIG. 11, a rear isometric view diagram of brackets 112 and bezel 108 in accordance with an embodiment are shown. As discussed above, each bracket may attach to a corresponding set of hooks of bezel 108. For example, second set of hooks 130 of bezel 108 may attach to second bracket 122 and first set of hooks 132 of bezel 108 may attach to first bracket 120. As seen from the figure, when attached to brackets 112 (e.g., first bracket 120 and second bracket 122), mechanical coupling 140 may prevent bezel 108 from disconnecting away from extension 110, unless sufficient force is applied to actuation mechanism 134 to allow for repositioning of second set of hooks 130 to allow the interference to be relieved.

While not shown, the mechanical coupling (e.g., 140) may include a linkage bar to mechanically link different sides of the bezel (e.g., 108) incase, for example, the first set of hooks (e.g., 132) is adapted to move instead of the second set of hooks (e.g., 130).

Thus, the data processing system illustrated in FIGS. 1-11 may provide improved utility by, for example, improving the environment in the chassis of the data processing system, improving configurations of bezels for data processing systems based on different chassis configurations, and/or may provide other benefits.

To facilitate use of a data processing system, the components of the data processing system may be assembled in a predetermined manner and/or disassembled.

Figure 12:
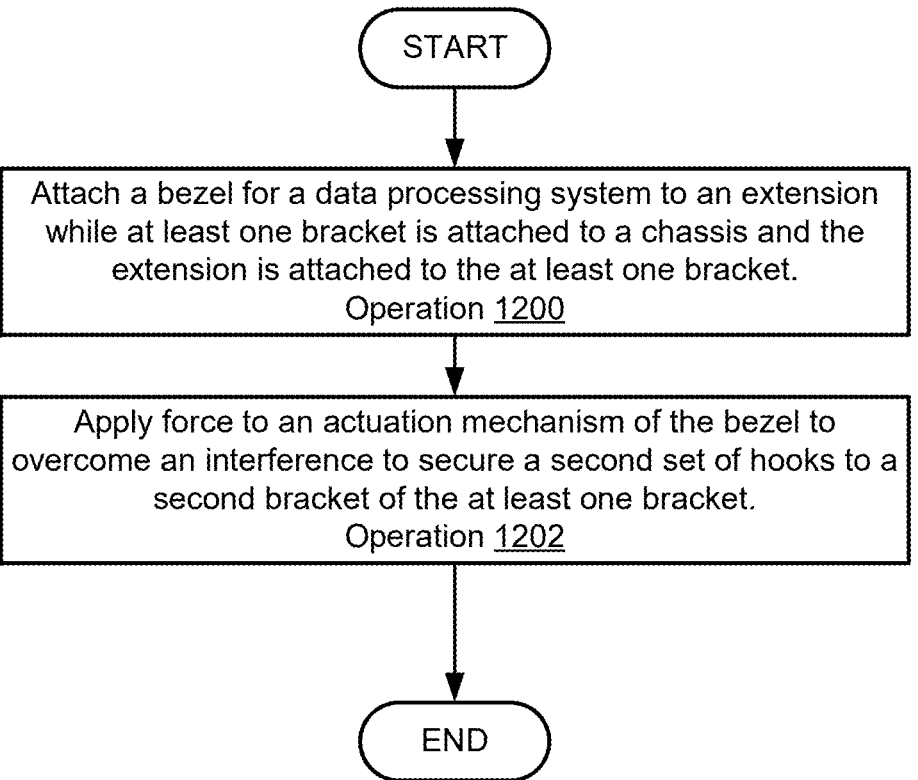
FIG. 12 shows a flow diagram illustrating a method in accordance with an embodiment.

Turning to FIG. 12, a flow diagram illustrating a method for assembling a data processing system in accordance with an embodiment is shown.

At operation 1200, a bezel for a data processing system may be attached to an extension while at least one bracket is attached to a chassis and the extension is attached to the at least one bracket. The bezel may be attached, for example, to the at least one bracket using a toe-in motion. For example, a first set of hooks positioned on a first side of the bezel may be adapted to fixedly secure the bezel to a first bracket of the at least one bracket and a second set of hooks may be adapted to fixedly secure the bezel to a second bracket of the at least one bracket.

At operation 1202, force is applied to an actuation mechanism of the bezel to overcome an interference to secure the second set of hooks to the second bracket of the at least one bracket. The force may be directed toward a front side of the bezel and toward the actuation mechanism. The amount of force may be selected based on the amount needed to overcome the interference. When such force is applied, the second set of hooks may deform to relieve the interference. When so relieved, the second set of hooks may move in a second position and connect to the second bracket of the at least one bracket. After connecting to the second bracket, the second set of hooks may return to their original position (e.g., the first position). Consequently, the bezel may be prevented from sliding or otherwise disconnecting from the at least one bracket. The force may be applied by a technician, or other person, or mechanical system (e.g., a robot).

The method may end following operation 1202.

The reverse process may be performed to disassemble the data processing system.

When so assembled, the hardware components may operate as a computing device.

Figure 13:
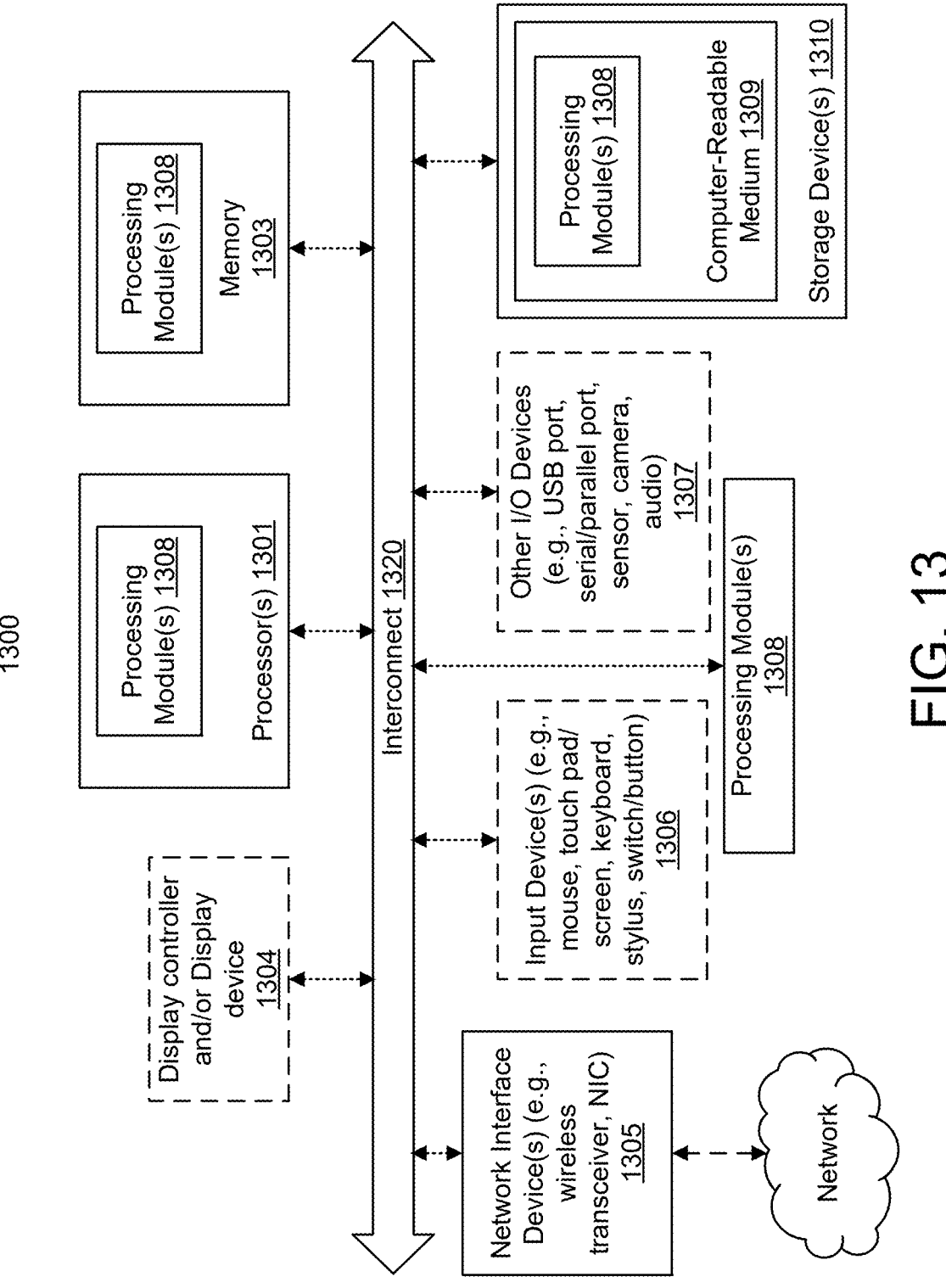
FIG. 13 shows a block diagram illustrating a data processing system in accordance with an embodiment.

Turning to FIG. 13, a block diagram illustrating an example of a computing device (e.g., a data processing system) in accordance with an embodiment is shown. For example, system 1300 may represent any of data processing systems described above performing any of the processes or methods described above. System 1300 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 1300 is intended to show a high level view of many components of the computer system. However, it is to be understood that additional components may be present in certain implementations and furthermore, different arrangement of the components shown may occur in other implementations. System 1300 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 1300 includes processor 1301, memory 1303, and devices 1305-1307 via a bus or an interconnect 1320. Processor 1301 may represent a single processor or multiple processors with a single processor core or multiple processor cores included therein. Processor 1301 may represent one or more general-purpose processors such as a microprocessor, a central processing unit (CPU), or the like. More particularly, processor 1301 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 1301 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 1301, which may be a low power multi-core processor socket such as an ultra-low voltage processor, may act as a main processing unit and central hub for communication with the various components of the system. Such processor can be implemented as a system on chip (SoC). Processor 1301 is configured to execute instructions for performing the operations discussed herein. System 1300 may further include a graphics interface that communicates with optional graphics subsystem 1304, which may include a display controller, a graphics processor, and/or a display device.

Processor 1301 may communicate with memory 1303, which in one embodiment can be implemented via multiple memory devices to provide for a given amount of system memory. Memory 1303 may include one or more volatile storage (or memory) devices such as random access memory (RAM), dynamic RAM (DRAM), synchronous DRAM (SDRAM), static RAM (SRAM), or other types of storage devices. Memory 1303 may store information including sequences of instructions that are executed by processor 1301, or any other device. For example, executable code and/or data of a variety of operating systems, device drivers, firmware (e.g., input output basic system or BIOS), and/or applications can be loaded in memory 1303 and executed by processor 1301. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 1300 may further include IO devices such as devices (e.g., 1305, 1306, 1307, 1308) including network interface device(s) 1305, optional input device(s) 1306, and other optional IO device(s) 1307. Network interface device (s) 1305 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 1306 may include a mouse, a touch pad, a touch sensitive screen (which may be integrated with a display device of optional graphics subsystem 1304), a pointer device such as a stylus, and/or a keyboard (e.g., physical keyboard or a virtual keyboard displayed as part of a touch sensitive screen). For example, input device(s) 1306 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 1307 may include an audio device. An audio device may include a speaker and/or a microphone to facilitate voice-enabled functions, such as voice recognition, voice replication, digital recording, and/or telephony functions. Other IO devices 1307 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 1307 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 1320 via a sensor hub (not shown), while other devices such as a keyboard or thermal sensor may be controlled by an embedded controller (not shown), dependent upon the specific configuration or design of system 1300.

To provide for persistent storage of information such as data, applications, one or more operating systems and so forth, a mass storage (not shown) may also couple to processor 1301. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also a flash device may be coupled to processor 1301, e.g., via a serial peripheral interface (SPI). This flash device may provide for non-volatile storage of system software, including a basic input/output software (BIOS) as well as other firmware of the system.

Storage device 1310 may include computer-readable storage medium 1309 (also known as a machine-readable storage medium or a computer-readable medium) on which is stored one or more sets of instructions or software (e.g., processing module, unit, and/or processing module/unit/logic 1308) embodying any one or more of the methodologies or functions described herein. Processing module/unit/logic 1308 may represent any of the components described above. Processing module/unit/logic 1308 may also reside, completely or at least partially, within memory 1303 and/or within processor 1301 during execution thereof by system 1300, memory 1303 and processor 1301 also constituting machine-accessible storage media. Processing module/unit/logic 1308 may further be transmitted or received over a network via network interface device(s) 1305.

Computer-readable storage medium 1309 may also be used to store some software functionalities described above persistently. While computer-readable storage medium 1309 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 1308, components and other features described herein can be implemented as discrete hardware components or integrated in the functionality of hardware components such as ASICS, FPGAs, DSPs or similar devices. In addition, processing module/unit/logic 1308 can be implemented as firmware or functional circuitry within hardware devices. Further, processing module/unit/logic 1308 can be implemented in any combination hardware devices and software components.

Note that while system 1300 is illustrated with various components of a data processing system, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A data processing system, comprising:
hardware components that are adapted to provide computer implemented services and positioned in a chassis;
the chassis; and
a bezel module comprising:
    at least one bracket adapted to directly attach to the chassis, an extension adapted to attach to the at least one bracket while the at least one bracket is attached to the chassis, and a bezel adapted to attach to the extension while the at least one bracket is attached to the chassis and the extension is attached to the at least one bracket, wherein the bezel comprises:

a first set of hooks positioned on a first side of the bezel, the first set of hooks is static and adapted to fixedly secure the bezel to a first bracket of the at least one bracket; and a second set of hooks that is mechanically coupled to an actuation mechanism of the bezel, the actuation mechanism being adapted to receive force from a user and actuate the second set of hooks when the force is received, wherein the bezel is further adapted to attach to a front side of the chassis independently from the at least one bracket and the extension, the at least one bracket being adapted to attach to a rear side of the chassis, wherein the extension comprises at least one opening for cables to traverse, the at least opening being on a side surface of the extension, and the chassis and bezel being on a front and a rear side of the extension while the bezel module is attached to the rear side of the chassis.

2. The data processing system of claim 1, wherein the bezel is adapted to attach to the at least one bracket using a toe-in motion.

3. The data processing system of claim 1, wherein the second set of hooks is dynamic and adapted to fixedly secure the bezel to a second bracket of the at least one bracket.

4. The data processing system of claim 1, wherein the second set of hooks are adapted to move between a first position and a second position based on actuations by the actuation mechanism, while in the first position the second set of hooks establish an interference with the at least one bracket to prevent the bezel from being disconnected from the at least one bracket, and while in the second position the interference is relieved to enable the bezel to be disconnected from the at least one bracket.

5. The data processing system of claim 4, wherein the bezel is adapted to be disconnected from the at least one bracket with a depression of the actuation mechanism and without depressions of any other actuation mechanisms.

6. The data processing system of claim 1, wherein the bezel comprises a mechanical coupling that mechanically couples the actuation mechanism to the second set of hooks, and that does not mechanically couple the actuation mechanism to the first set of hooks.

7. The data processing system of claim 1, wherein the extension is adapted to facilitate routing of the cables to the rear side of the chassis while the bezel module is attached to the rear side of the chassis.

8. A system, comprising:

a chassis for housing hardware components that are adapted to provide computer implemented services; and a bezel module comprising:

at least one bracket adapted to directly attach to the chassis, an extension adapted to attach to the at least one bracket while the at least one bracket is attached to the chassis, and a bezel adapted to attach to the extension while the at least one bracket is attached to the chassis and the extension is attached to the at least one bracket, wherein the bezel comprises:

a first set of hooks positioned on a first side of the bezel, the first set of hooks is static and adapted to fixedly secure the bezel to a first bracket of the at least one bracket; and a second set of hooks that is mechanically coupled to an actuation mechanism of the bezel, the actuation mechanism being adapted to receive force from a user and actuate the second set of hooks when the force is received, wherein the bezel is further adapted to attach to a front side of the chassis independently from the at least one bracket and the extension, the at least one bracket being adapted to attach to a rear side of the chassis, wherein the extension comprises at least one opening for cables to traverse, the at least opening being on a side surface of the extension, and the chassis and bezel being on a front and a rear side of the extension while the bezel module is attached to the rear side of the chassis.

9. The system of claim 8, wherein the bezel is adapted to attach to the at least one bracket using a toe-in motion.

10. The system of claim 8, wherein the second set of hooks is dynamic and adapted to fixedly secure the bezel to a second bracket of the at least one bracket.

11. The system of claim 8, wherein the bezel comprises a mechanical coupling that mechanically couples the actuation mechanism to the second set of hooks, and that does not mechanically couple the actuation mechanism to the first set of hooks.

12. The system of claim 8, wherein the extension is adapted to facilitate routing of the cables to the rear side of the chassis while the bezel module is attached to the rear side of the chassis.

13. The system of claim 8, wherein the second set of hooks are adapted to move between a first position and a second position based on actuations by the actuation mechanism, while in the first position the second set of hooks establish an interference with the at least one bracket to prevent the bezel from being disconnected from the at least one bracket, and while in the second position the interference is relieved to enable the bezel to be disconnected from the at least one bracket.

14. The system of claim 13, wherein the bezel is adapted to be disconnected from the at least one bracket with a depression of the actuation mechanism and without depressions of any other actuation mechanisms.

15. A bezel module, comprising:

at least one bracket adapted to directly attach to a chassis for housing hardware components that are adapted to provide computer implemented services, an extension adapted to attach to the at least one bracket while the at least one bracket is attached to the chassis, and a bezel adapted to attach to the extension while the at least one bracket is attached to the chassis and the extension is attached to the at least one bracket, wherein the bezel comprises:

a first set of hooks positioned on a first side of the bezel, the first set of hooks is static and adapted to fixedly secure the bezel to a first bracket of the at least one bracket; and a second set of hooks that is mechanically coupled to an actuation mechanism of the bezel, the actuation mechanism being adapted to receive force from a user and actuate the second set of hooks when the force is received, wherein the bezel is further adapted to attach to a front side of the chassis independently from the at least one bracket and the extension, the at least one bracket being adapted to attach to a rear side of the chassis, wherein the extension comprises at least one opening for cables to traverse, the at least opening being on a side surface of the extension, and the chassis and bezel being on a front and a rear side of the extension while the bezel module is attached to the rear side of the chassis.

16. The bezel module of claim 15, wherein the bezel is adapted to attach to the at least one bracket using a toe-in motion.

17. The bezel module of claim 15, wherein the second set of hooks is dynamic and adapted to fixedly secure the bezel to a second bracket of the at least one bracket.

18. The bezel module of claim 15, wherein the bezel comprises a mechanical coupling that mechanically couples the actuation mechanism to the second set of hooks, and that does not mechanically couple the actuation mechanism to the first set of hooks.

19. The bezel module of claim 15, wherein the second set of hooks are adapted to move between a first position and a second position based on actuations by the actuation mechanism, while in the first position the second set of hooks establish an interference with the at least one bracket to prevent the bezel from being disconnected from the at least one bracket, and while in the second position the interference is relieved to enable the bezel to be disconnected from the at least one bracket.

20. The bezel module of claim 19, wherein the bezel is adapted to be disconnected from the at least one bracket with a depression of the actuation mechanism and without depressions of any other actuation mechanisms.

* * * * *